United States Patent [19]

Takagi

[11] Patent Number: 5,751,754
[45] Date of Patent: May 12, 1998

[54] SEMICONDUCTOR LASER INCLUDING TUNNEL DIODE FOR REDUCING CONTACT RESISTANCE

[75] Inventor: Kazuhisa Takagi, Tokyo, Japan

[73] Assignee: Mitsubishi Denki Kabushiki Kaisha, Tokyo, Japan

[21] Appl. No.: 594,467

[22] Filed: Jan. 31, 1996

[30] Foreign Application Priority Data

Sep. 7, 1995 [JP] Japan .................................. 7-230006

[51] Int. Cl.$^6$ .................................................. H01S 3/19
[52] U.S. Cl. .................................................. 372/46; 372/45
[58] Field of Search ................................ 372/45, 43, 46, 372/50

[56] References Cited

U.S. PATENT DOCUMENTS

| | | | |
|---|---|---|---|
| 5,212,706 | 5/1993 | Jain | 372/50 |
| 5,365,536 | 11/1994 | Seki | 372/45 |
| 5,452,316 | 9/1995 | Seki et al. | 372/45 |

FOREIGN PATENT DOCUMENTS 690063  3/1994  Japan .

OTHER PUBLICATIONS

Dautremont-Smith et al, "A Nonalloyed, Low Specific Resistance Ohmic Contact To n-InP", Journal of Vacuum Science, vol. B2, No. 4, 1984, pp. 620-625.

Primary Examiner—Rodney B. Bovernick
Assistant Examiner—Yisun Song
Attorney, Agent, or Firm—Leydig, Voit & Mayer, Ltd.

[57] ABSTRACT

A semiconductor laser includes an n type semiconductor substrate, an n type cladding layer, an active layer having an effective band gap energy, a p type cladding layer, and a tunnel diode structure including a high dopant concentration p type semiconductor layer and a high dopant concentration n type semiconductor layer having an effective band gap energy larger than the effective band gap energy of the active layer, a p side electrode disposed on the tunnel diode structure, and an n side electrode disposed on the rear surface of the n type semiconductor substrate. Since this semiconductor laser includes the tunnel diode structure disposed in the reverse bias direction with respect to the current flow direction, the contact resistivity of the ohmic contact of the p side electrode is lowered as compared to the case where the p side electrode is disposed on a p type semiconductor layer. The effective contact resistivity of the p side electrode is reduced. As a result, a semiconductor laser including a p side electrode having a low contact resistivity ohmic contact is realized.

9 Claims, 3 Drawing Sheets

SEMICONDUCTOR LASER INCLUDING TUNNEL DIODE FOR REDUCING CONTACT RESISTANCE

FIELD OF THE INVENTION

The present invention relates to a semiconductor laser including an electrode providing an ohmic contact having a low contact resistivity.

BACKGROUND OF THE INVENTION

FIG. 5 is a perspective view illustrating a prior art semiconductor laser. In the figure, reference numeral 10 designates an n type InP substrate. An n type InP cladding layer 9 having a thickness of about 1.8 μm and a dopant concentration of 1~2×10$^{18}$ cm$^{-3}$ is disposed on the n type InP substrate 10. An undoped InGaAsP active layer 8 about 0.2 μm thick is disposed on the cladding layer 9. A p type InP cladding layer 7 having a dopant concentration of 2×10$^{18}$ cm$^{-3}$ is disposed on the active layer 8. An upper portion of the substrate 10, the cladding layer 9, the active layer 8, and the cladding layer 7 form a stripe-shaped mesa structure. Intrinsic (hereinafter referred to as i type) InP current blocking layers 5a and 5b and an n type InP current blocking layer 6 having a dopant concentration of 1×10$^{18}$ cm$^{-3}$ are disposed on the substrate 10 at opposite sides of the mesa structure. A p type InP cap layer having a dopant concentration of 2×10$^{18}$ cm$^{-3}$ is disposed on the p type InP cladding layer 7 and on the i type InP current blocking layer 5a. The thicknesses of the cap layer 4 and the cladding layer 7 are about 1.8 μm in total. A p type InGaAs contact layer 19 having a thickness of 1~2 μm and a dopant concentration of 1×10$^{19}$ cm$^{-3}$ is disposed on the cap layer 4. A p side electrode 1 is disposed on the contact layer 19. The p side electrode 1 comprises Cr/Au, that is, a Cr layer deposited on the contact layer 19 by vacuum evaporation and an Au layer electroplated on the Cr layer. An n side electrode 11 comprising Cr/Au is disposed on the rear surface of the substrate 10. The p side electrode 1 and the n side electrode 11 may comprise Ti/Pt/Au that is obtained by electroplating an Au layer on a lamination of a single Ti layer and a single Pt layer or on alternatingly laminated Ti layers and Pt layers.

A description is given of the fabricating method.

Initially, the n type InP cladding layer 9, the undoped InGaAsP active layer 8, and the p type InP cladding layer 7 are successively grown on the n type InP substrate 10 by MOCVD (Metal Organic Chemical Vapor Deposition).

Then, a stripe-shaped insulating film (not shown) comprising SiN or the like is formed on the p type InP cladding layer 7. Using the insulating film as a mask, the grown layers are etched from the p type InP cladding layer 7 to a depth reaching the substrate 10, thereby forming the stripe-shaped mesa structure. Thereafter, using the insulating film as a mask, the current blocking layers 5a, 6, and 5b are successively grown on the substrate 10 by MOCVD so that the mesa structure is buried in the current blocking layers.

After removal of the insulating film, the cap layer 4 and the contact layer 19 are successively grown on the current blocking layer 5b and on the p type InP cladding layer 7. Thereafter, a Cr layer is deposited on the contact layer 19 by vacuum evaporation and an Au layer is electroplated on the Cr layer to produce the p side electrode 1, and a Cr layer is deposited on the rear surface of the substrate 10 and an Au layer is electroplated on the Cr layer to produce the n side electrode 11, thereby completing the semiconductor laser shown in FIG. 5.

A description is given of the operation.

When current flows across the laser structure with the p side electrode on the positive side and the n side electrode on the negative side, holes are injected into the active layer 8 from the p side electrode 1 through the p type contact layer 19, the p type cap layer 4, and the p type cladding layer 7 and, simultaneously, electrons are injected into the active layer 8 from the n side electrode 11 through the n type substrate 10 and the n type cladding layer 9. The holes and the electrodes recombine to produce laser light in the active layer 8. No current flows in the region where the i type current blocking layers 5a and 5b and the n type current blocking layer 6 are presents. In other words, current is concentrated in the mesa structure.

In the above-described semiconductor laser, the p type InGaAs contact layer 19 is necessary for making an ohmic contact having a low contact resistivity between the Cr/Au electrode 1 and the semiconductor layers. When the p side electrode 1 is disposed directly on the p type InP cap layer 4 without inserting the contact layer 19 between them, because the difference in vacuum levels between p type InP and an electrode metal, such as Cr, is larger than the difference in vacuum levels between n type InP and the electrode metal, it is difficult to make an ohmic electrode having a low contact resistivity with high stability as compared with the case where the n side electrode 11 is produced on the rear surface of the n type InP substrate 10. For example, when Cr is employed as the electrode metal, since the work function of Cr is 4.5 eV and the work function of p type InP is 5.9 eV, the difference is 1.4 eV. On the other hand, since the work function of n type InP is 4.1 eV, the difference is only 0.4 eV. Therefore, it is difficult to make an ohmic electrode having a low contact resistivity between the p type InP layer and the electrode metal.

When the p type InGaAs contact layer 19 is grown on the p type InP cap layer 4, since p type InGaAs can be doped with dopant impurity to a high concentration, for-example, about 1×10$^{19}$ cm$^{-3}$, as compared to p type InP, it is possible to provide an ohmic electrode having a low contact resistivity for the p side electrode 1.

However, p type InGaAs has an absorption coefficient as high as 8×10$^{3}$ cm$^{-1}$ to light having a wavelength of 1~1.5 μm. In addition, it has a relatively large refractive index of 3.55 whereas the refractive index of InP constituting the p type cladding layer 7 is 3.18. Therefore, when the InGaAs layer 19 is located close to the active layer 8, especially when the active layer produces laser light having a wavelength longer than 1 μm, a portion of the laser light is absorbed in the p type InGaAs layer 19, resulting in degradation of laser characteristics, such as efficiency and threshold current.

In order to avoid the above-described problem, the thickness of the p type InP cap layer 4 must be increased to prevent the laser light produced in the active layer from reaching the p type InGaAs contact layer 19.

FIG. 3 is a graph illustrating a distribution of light intensity in the direction perpendicular to the surface of the substrate 1 in the semiconductor laser in which the active layer 8 comprises InGaAsP and the p type cladding layer 7 comprises InP. In the figure, the abscissa shows distance in a direction perpendicular to the growth surface of the substrate 1, and the ordinate shows the light intensity with the maximum value of 1.

FIG. 4 is a graph illustrating the relationship between the distance between the active layer 8 and the p type InGaAs contact layer 19 and the light absorption loss due to the InGaAs contact layer 19, which is calculated on the basis of the light intensity distribution shown in FIG. 3. In FIG. 4, the abscissa shows the distance between the active layer 8 and the InGaAs contact layer 19, and the ordinate shows the light absorption loss due to the InGaAs contact layer 19. The wavelength of the laser light is 1.55 μm.

As can be seen from FIG. 4, in order to avoid the influence of light absorption due to the p type InGaAs contact layer 19, the distance between the active layer 8 and the InGaAs contact layer 19 must be longer than 2 μm.

In order to place the p type InGaAs contact layer 19 more than 2 μm away from the active layer 8, it is necessary to grow the p type InP cladding layer 7 and the p type InP cap layer 4 to a thickness larger than 2 μm. However, since the crystal growth rate is about 1 μm/hour in an ordinary MOCVD method, it takes more than two hours to grow a p type InP layer thicker than 2 μm, resulting in a reduction in the productivity of the semiconductor laser. The reduction in productivity causes an increase in the cost of the semiconductor laser.

As described above, in the prior art semiconductor laser, the p type InGaAs contact layer 19 is used to make a good ohmic contact with the p side electrode 1. However, since a p type InP layer thicker than 2 μm must be grown to prevent light absorption due to the p type InGaAs contact layer 19, the productivity of the semiconductor laser is poor. Therefore, it is difficult to produce a semiconductor laser at a low cost and having a p side electrode providing an ohmic contact having a low contact resistivity.

In order to reduce the cost of the semiconductor laser, a semiconductor laser including, in place of the p type InGaAs contact layer 19, a structure having less light absorption and making a reliable ohmic contact with a material of a p side electrode has been demanded.

SUMMARY OF THE INVENTION

It is an object of the present invention to provide a semiconductor laser that includes a p side electrode providing an ohmic contact having a low contact resistivity and that is produced at high productivity.

Other objects and advantages of the invention will become apparent from the detailed description that follows. The detailed description and specific embodiments described are provided only for illustration since various additions and modifications within the spirit and scope of the invention will be apparent to those of skill in the art from the detailed description.

According to a first aspect of the present invention, a semiconductor laser comprises an n type semiconductor substrate having opposed front and rear surfaces; an n type cladding layer disposed on the front surface of the n type semiconductor substrate; an active layer disposed on the n type cladding layer and having an effective band gap energy; a p type cladding layer disposed on the active layer; a tunnel diode structure comprising a high dopant concentration p type semiconductor layer and a high dopant concentration n type semiconductor layer, these semiconductor layers comprising a material having an effective band gap energy larger than the band gap energy of the active layer and being disposed on the p type cladding layer in this order; a p side electrode disposed on the tunnel diode structure and comprising a metal having a low contact resistivity to an n type semiconductor material; and an n side electrode disposed on the rear surface of the n type semiconductor substrate and having a low contact resistivity to an n type semiconductor material. Since this semiconductor laser includes the tunnel diode structure in which the high dopant concentration p type semiconductor layer and the high dopant concentration n type semiconductor layer are disposed in the reverse bias direction with respect to the current flowing direction, the p side electrode can be disposed on the high dopant concentration n type semiconductor layer, whereby the contact resistivity of the ohmic contact of the p side electrode is lowered as compared to the case where the p side electrode is disposed on a p type semiconductor layer. In addition, the contact resistivity in the tunnel diode structure is also small. Therefore, the effective contact resistivity of the p side electrode is reduced. As a result, a semiconductor laser including a p side electrode providing an ohmic contact of a low contact resistivity is realized. Furthermore, since the band gap energies of the high dopant concentration p type semiconductor layer and the high dopant concentration n type semiconductor layer are higher than the band gap energy of the active layer, light produced in the active layer is not absorbed by the tunnel diode structure. Therefore, it is not necessary to increase the distance between the active layer and the tunnel diode structure with broadening of light produced in the active layer, so that the process for increasing the distance between the active layer and the tunnel diode structure is dispensed with. As a result, the productivity of the semiconductor laser is improved.

According to a second aspect of the present invention, a semiconductor laser comprises an n type semiconductor substrate having opposed front and rear surfaces; a tunnel diode structure comprising a high dopant concentration n type semiconductor layer and a high dopant concentration p type semiconductor layer, these semiconductor layers comprising a material having an effective bend gap energy and being disposed on the p type cladding layer in this order; a p type cladding layer disposed on the tunnel diode structure; an active layer disposed on the p type cladding layer and comprising a material having an effective band gap energy smaller than the effective band gap energy of the semiconductor layers constituting the tunnel diode structure; an n type cladding layer disposed on the active layer; an n type contact layer disposed on the n type cladding layer; an n side electrode disposed on the n type contact layer and comprising a metal having a low contact resistivity to an n type semiconductor material; and a p side electrode disposed on the rear surface of the substrate and comprising a metal having a low contact resistivity to an n type semiconductor material. Since this semiconductor laser includes the tunnel diode structure in which the high dopant concentration p type semiconductor layer and the high dopant concentration n type semiconductor layer are disposed in the reverse bias direction with respect to the current flowing direction, the p side electrode can be disposed on the rear surface of the n type substrate, whereby the contact resistivity of the ohmic contact of the p side electrode is lowered as compared to the case where the p side electrode is disposed on a p type semiconductor layer. In addition, the contact resistivity in the tunnel diode structure is also small. Therefore, the effective contact resistivity of the p side electrode is reduced. As a result, a semiconductor laser including a p side electrode providing an ohmic contact of a low contact resistivity is realized.

DETAILED DESCRIPTION OF THE PREFERRED EMBODIMENTS

Figure 1:
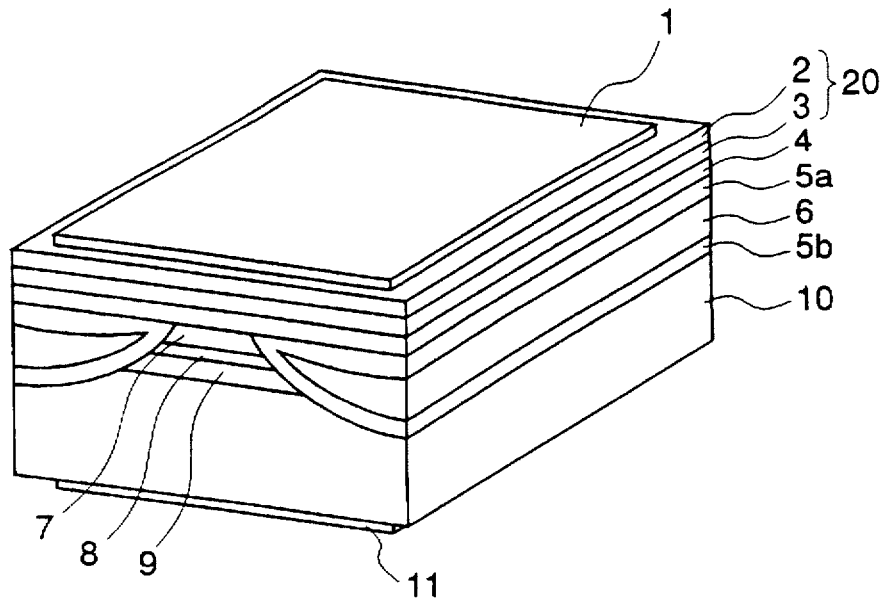
FIG. 1 is a perspective view illustrating a semiconductor laser in accordance with a first embodiment of the present invention.

FIG. 1 is a perspective view illustrating a semiconductor laser in accordance with a first embodiment of the present invention. In the figure, reference numeral 10 designates an n type InP substrate. An n type InP cladding layer 9 having a thickness of about 1.8 µm and a dopant concentration of $1\sim2\times10^{18}$ cm$^{-3}$ is disposed on the n type InP substrate 10. An undoped InGaAsP active layer 8 about 0.2 µm thick is disposed on the cladding layer 9. A p type InP cladding layer 7 having a dopant concentration of $2\times10^{18}$ cm$^{-3}$ is disposed on the active layer 8. An upper portion of the substrate 10, the cladding layer 9, the active layer 8, and the cladding layer 7 form a stripe-shaped mesa structure. Intrinsic (hereinafter referred to as i type) InP current blocking layers 5a and 5b and an n type InP current blocking layer 6 having a dopant concentration of $1\times10^{18}$ cm$^{-3}$ are disposed on the substrate 10 at opposite sides of the mesa structure. A p type InP cap layer having a dopant concentration of $2\times10^{18}$ cm$^{-3}$ is disposed on the p type InP cladding layer 7 and on the i type InP current blocking layer 5a. A high dopant concentration p type (hereinafter referred to as p$^+$ type) InP layer 3 having a dopant concentration of about $6.3\times10^{18}$ cm$^{-3}$ is disposed on the cap layer 4. A high dopant concentration n type (hereinafter referred to as n$^+$ type) InP layer 2 having a dopant concentration of about $6.3\times10^{18}$ cm$^{-3}$ is disposed on the p$^+$ type InP layer 3. The p$^+$ type InP layer 3 and the n$^+$ type InP layer 2 produce a tunnel diode structure 20. A p side electrode 1 is disposed on the n$^+$ type InP layer 2. The p side electrode 1 comprises a material that makes an ohmic contact having a low contact resistivity with the n$^+$ type InP layer 2. In this first embodiment, Cr/Au, i.e., a Cr layer deposited by vacuum evaporation and an Au layer electroplated on the Cr layer, is employed. Alternatively, Ti/Pt/Au that is produced by electroplating an Au layer on a lamination of a single Ti layer and a single Pt layer or on alternatingly laminated Ti layers and Pt layers may be employed. An n side electrode 11 comprising a material that makes an ohmic contact with the substrate is disposed on the rear surface of the substrate 10. In this embodiment, Cr/Au is employed for the n side electrode 11. Alternatively, Ti/Pt/Au may be employed.

A description is given of the fabricating method.

Initially, the n type InP cladding layer 9, the undoped InGaAsP active layer 8, and the p type InP cladding layer 7 are successively grown on the n type InP substrate 10, preferably by MOCVD.

Then, a stripe-shaped insulating film (not shown) comprising SiN or the like is formed on the p type InP cladding layer 7. Using this insulating film as a mask, the grown layers are etched from the p type InP cladding layer 7 until reaching the substrate 10, thereby forming the stripe-shaped mesa structure. Thereafter, using the insulating film as a mask, the current blocking layers 5a, 6, and 5b are successively grown on the substrate 10 in this order by MOCVD so that the mesa structure is buried in the current blocking layers.

After removal of the insulating film, the cap layer 4, the p$^+$ type InP layer 3, and the n$^+$ type InP layer 2 are successively formed on the current blocking layer 5b and on the p type InP cladding layer 7. Thereafter, a Cr layer about 0.5 µm thick is deposited on the n$^+$ type InP layer 2 by vacuum evaporation and an Au layer 3–4 µm thick is electroplated on the Cr layer to produce the p side electrode 1. On the rear surface of the substrate 10, the n side electrode 11 comprising Cr/Au is produced in the same manner as that for the p side electrode 1, thereby completing the semiconductor laser shown in FIG. 1.

A description is given of the operation.

When a forward bias is applied to the laser structure with the p side electrode 1 on the positive side and the n side electrode 11 on the negative side, current flows from the p side electrode 1 toward the n side electrode 11, and holes are injected into the active layer 8 from the p side electrode 1 through the n$^+$ type InP layer 2, the p$^+$ type InP layer 3, the p type cap layer 4, and the p type cladding layer 7 and, simultaneously, electrons are injected into the active layer 8 from the n side electrode 11 through the n type substrate 10 and the n type cladding layer 9. The holes and the electrodes recombine to produce laser light in the active layer 8, whereby laser oscillation occurs. In the semiconductor laser according to this first embodiment, the tunnel diode structure 20 comprising the n$^+$ type InP layer 2 and the p$^+$ type InP layer 3 is interposed between the p side electrode 1 and the p type cap layer 4. Although a reverse bias voltage is applied to the tunnel diode structure 20, since the tunnel diode structure 20 is highly doped with dopant impurities, a tunneling effect occurs, so that the voltage drop due to the reverse bias is very small. Therefore, the tunnel diode structure 20 does not significantly influence the voltage drop of the entire laser structure. Further, in the semiconductor laser having the stripe-shaped mesa structure shown in FIG. 1, no current flows in the region where the i type current blocking layers 5a and 5b and the n type current blocking layer 6 are present. In other words, current is concentrated in the mesa structure. The current blocking structure is not restricted to that shown in figure 1. Other current blocking structures used in ordinary semiconductor lasers may be employed.

In the semiconductor laser according to this first embodiment of the invention, the tunnel diode structure 20 comprising the p$^+$ type InP layer 3 and the n$^+$ type InP layer 2 is disposed on the p type cap layer 4 with the p$^+$ type InP layer 3 contacting the cap layer, and the p side electrode 1 is disposed on the n$^+$ type InP layer 2 of the tunnel diode structure 20. Since the n$^+$ type InP layer 2 contacting the p side electrode 1 comprises n type InP that easily makes an ohmic contact having a low contact resistivity with the electrode metal, the difference in vacuum levels between the n$^+$ type InP layer 2 and the p side electrode 1 is smaller than the difference in vacuum levels between p type InP and the p side electrode 1, whereby the contact resistivity is reduced compared to the case where the p side electrode 1 is formed on a p type InP layer. As a result, a very low contact resistivity, for example, lower than $1\times10^{-6}$ $\Omega$cm$^2$, is easily obtained at a part of the p side electrode 1 contacting the semiconductor layer of the semiconductor laser.

Since both the n$^+$ type InP layer 2 and the p$^+$ type InP layer 3 comprise the same semiconductor material as the p type cladding layer 7, these layers are transparent to light emitted from the active layer 8, so that the light absorption loss is very small. For example, as described in page 750 of "Physics of Semiconductor Device" written by S. M. Sze, the absorption loss is smaller than 10 cm$^{-1}$ to light having a wavelength exceeding 1 μm, which means that the InP layers 2 and 3 hardly absorb light having a wavelength exceeding 1 μm.

Figure 4:
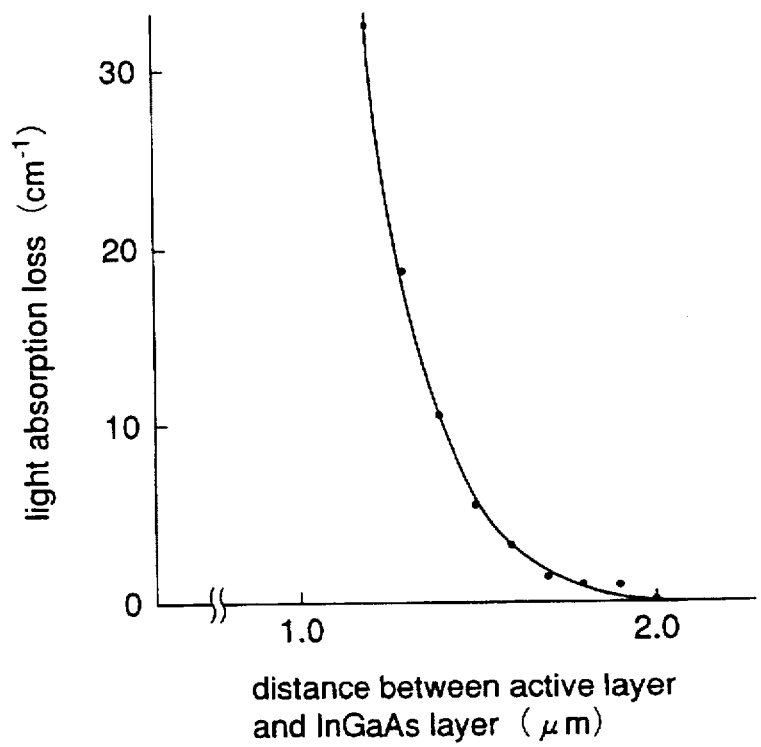
FIG. 4 is a graph illustrating the relationship between the distance between an InGaAs contact layer and an active layer and the absorption of light by the InGaAs contact layer according to the prior art.
Figure 5:
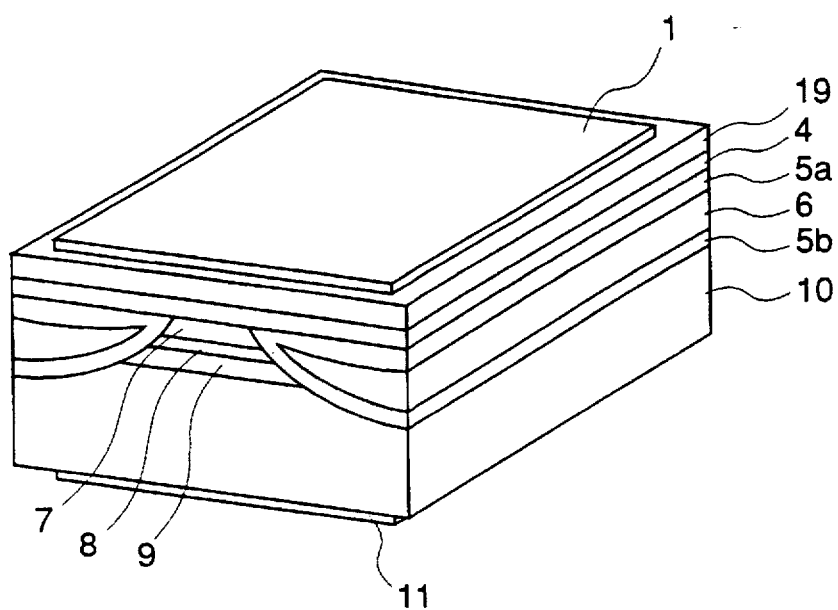
FIG. 5 is a perspective view illustrating a semiconductor laser according to the prior art.

Now, a description is given of a difference in absorption coefficients between the semiconductor laser according to this first embodiment and the prior art semiconductor laser shown in FIG. 5. For example, in a semiconductor laser producing light having a wavelength of 1.5 μm, when the distance from the active layer 8 to the p type InGaAs contact layer 19 is 1.8 μm in the prior art structure shown in FIG. 5, the absorption coefficient of the p type InGaAs contact layer 19 obtained from FIG. 4 is 0.8 cm$^{-1}$. However, the laser structure according to the first embodiment includes the tunnel diode structure 20 comprising the n$^+$ type InP layer 2 and the p$^+$ type InP layer 3 in place of the contact layer 19, so that the absorption does not occur. Since the absorption coefficient of the active layer 8 is about 20 .cm$^{-1}$, the reduction in the absorption loss by 0.8 cm$^{-1}$ results in a 4% improvement of the absorption loss. Accordingly, it is not necessary to increase the thicknesses of the p type cladding layer and the p type cap layer 4 with broadening of light produced in the active layer 8 to avoid the influence of the absorption loss. As a result, the fabricating process is simplified and the productivity of the semiconductor laser is improved.

Further, in the laser structure according to this first embodiment of the invention, since a contact resistance is produced at the interface of the n$^+$ type InP layer 2 and the p$^+$ type InP layer 3 within the tunnel diode structure 20 and the contact resistance of the p side electrode 1 with the n$^+$ type InP layer 2 is very low, it might be thought that the substantial contact resistance of the p side electrode 1 is the contact resistance within the tunnel diode structure 20. However, the contact resistivity at the interface of the n$^+$ type InP layer 2 and the p$^+$ type InP layer 3 in the tunnel diode structure 20 is 1×10$^{-5}$ Ωcm$^2$ when both the n$^+$ type InP layer 2 and the p$^+$ type InP layer 3 have a carrier concentration of 6.3×10$^{18}$ cm$^{-3}$, and this contact resistivity is equivalent to the contact resistivity at the interface of the p type InGaAs contact layer 19 and the p side electrode 1 comprising Cr/Au in the prior art semiconductor laser. When the carrier concentrations of the n$^+$ type InP layer 2 and the p$^+$ type InP layer 3 are increased to 1×10$^{19}$ cm$^{-3}$, the contact resistivity is reduced to 4×10$^{-6}$ Ωcm$^2$, resulting in about a 60% reduction in the contact resistivity compared to the contact resistivity between the p type InGaAs contact layer 19 and the p side electrode 1 in the prior art semiconductor laser. Accordingly, in this first embodiment of the invention, the substantial contact resistivity of the p side electrode of the semiconductor laser is reduced by increasing the carrier concentrations of the n$^+$ type InP layer 2 and the p$^+$ type InP layer 3, preferably to a carrier concentration exceeding 6.3×10$^{18}$ cm$^{-3}$.

As described above, according to the first embodiment of the present invention, the stripe-shaped mesa structure comprising the n type cladding layer 9, the active layer 8, and the p type cladding layer 7 is disposed on the n type InP substrate 1, and the i type current blocking layer 5a, the n type current blocking layer 6, and the i type current blocking layer 5b are disposed contacting the opposite sides of the mesa structure. Further, the p type cap layer 4 and the tunnel diode structure 20 comprising the p$^+$ type InP layer 3 and the n$^+$ type InP layer 2 are disposed on the p type cladding layer 7 and on the p type cap layer 4, and the p side electrode 1 is disposed on the n$^+$ type InP layer 2. In this laser structure, since the p side electrode 1 contacts the n$^+$ InP layer 2, the contact resistance between the p side electrode 1 and the tunnel diode structure 20 is reduced and the contact resistance within the tunnel diode structure 20 is reduced, whereby the contact resistivity of the p side electrode 1 is reduced.

Furthermore, since the tunnel diode structure 20 comprises InP that does not absorb light produced in the active layer 8, the absorption loss of the light is avoided. Therefore, the thicknesses of the p type cladding layer 7 and the p type cap layer 4 can be reduced, whereby the productivity of the semiconductor laser is improved.

[Embodiment 2]

Figure 2:
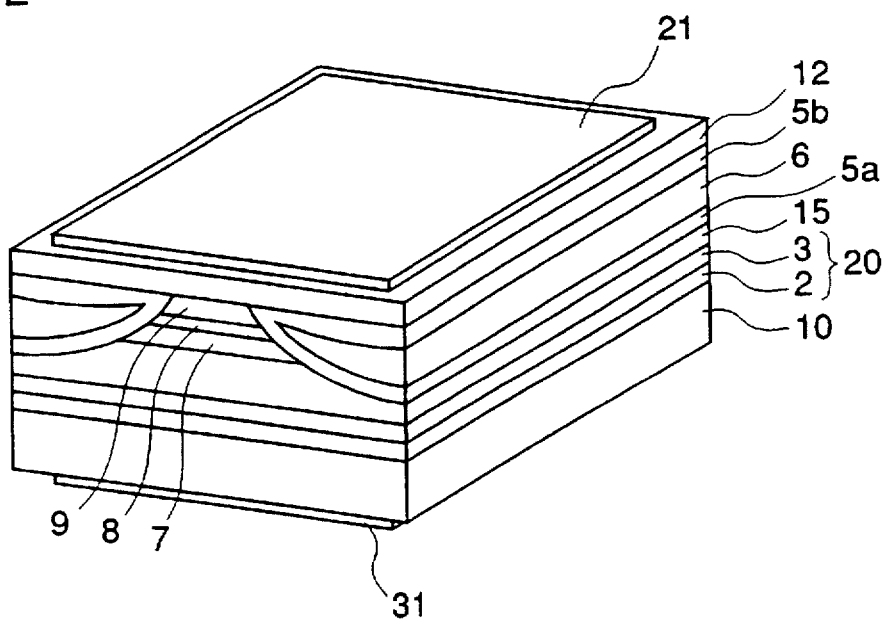
FIG. 2 is a perspective view illustrating a semiconductor laser in accordance with a second embodiment of the present invention.
Figure 3:
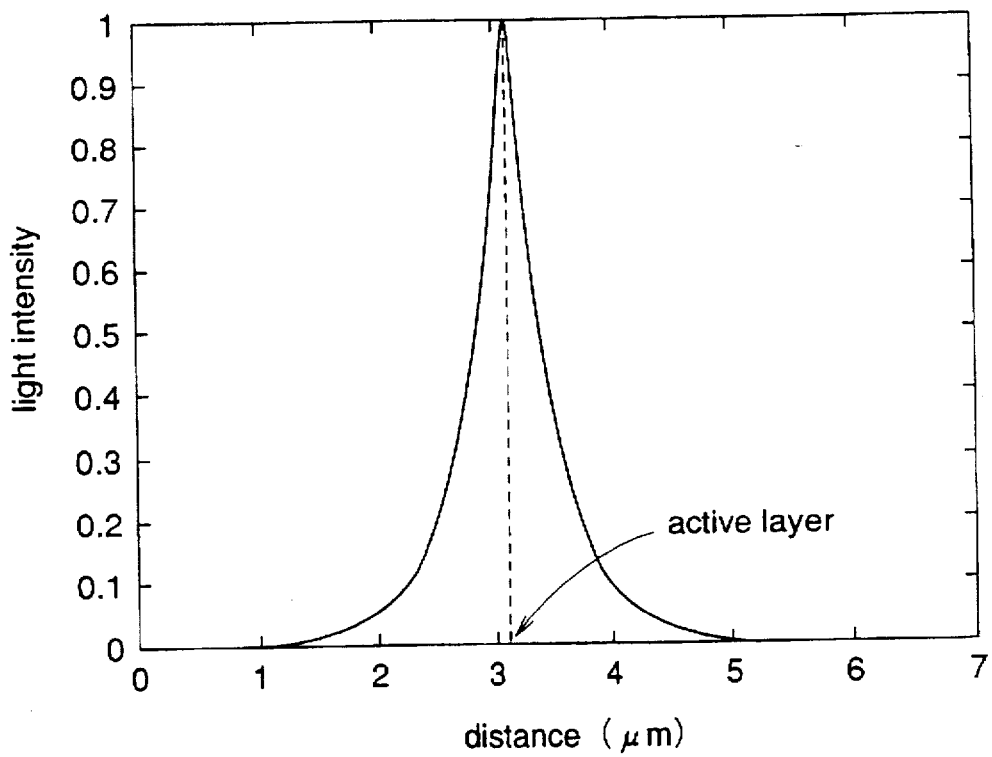
FIG. 3 is a graph illustrating a distribution of light intensity in a direction perpendicular to a substrate in a semiconductor laser according to the prior art.

FIG. 2 is a perspective view illustrating a semiconductor laser in accordance with a second embodiment of the present invention. In FIG. 2, the same reference numerals as those in FIG. 1 designate the same or corresponding parts. Reference numeral 12 designates an n type InP contact layer. An n side electrode 21 comprising a metal that easily makes an ohmic contact with the contact layer 12 is disposed on the contact layer 12. Preferably, the n side electrode 21 comprises Cr/Au, that is, a Cr layer deposited by vacuum evaporation and an Au layer electroplated on the Cr layer. A p side electrode 31 comprising a metal that easily makes an ohmic contact with the n type InP substrate 10 is disposed on the rear surface of the substrate 10. Preferably, the p side electrode 31 comprises Cr/Au. Reference numeral 15 designates an n type InP buffer layer having a dopant concentration of about 2×10$^{18}$ cm$^{-3}$.

The prior art semiconductor laser shown in FIG. 5 oscillates when a voltage is applied so that the electrode on the rear side of the substrate is negative and the electrode on the front side of the substrate is positive. However, there is a case where a semiconductor laser that oscillates when a voltage is applied so that the electrode on the rear side of the substrate is positive and the electrode on the front side of the substrate is negative is required. In this case, the prior art semiconductor laser is transformed as follows. That is, a p type substrate takes the place of the n type substrate 10, a p type InP cladding layer takes the place of the n type cladding layer 9, an n type InP cladding layer takes the place of the p type cladding layer 7, and an n type InP contact layer takes the place of the p type cap layer 4 and the p type contact layer 19, an n side electrode takes the place of the p side electrode 1, a p side electrode takes the place of the n side electrode 11, providing a semiconductor laser in which the conductivity type of the substrate is opposite to that of the prior art laser. Thereby, a semiconductor laser that oscillates when a voltage is applied so that the electrode on the rear side of the substrate is positive and the electrode on the front side of the substrate is negative is realized. However, in this semiconductor laser, it is very difficult to produce the p side electrode on the rear side of the p type InP substrate with an ohmic contact of a low contact resistance between them. This is an obstacle to improvement of characteristics of the device.

The above-described problem is solved in this second embodiment of the invention. In this second embodiment, as shown in FIG. 2, an n type InP substrate 10 is employed, and a tunnel diode structure 20 comprising an n$^+$ type InP layer 2 contacting the substrate 10 and a p$^+$ type InP layer 3 is disposed on the substrate 10. A p type InP buffer layer 15 is disposed on the tunnel diode structure 20. A p type InP cladding layer 7 is disposed on the buffer layer 15. An undoped InGaAsP active layer 8 is disposed on the cladding layer 7. An n type InP cladding layer 9 is disposed on the active layer 8. The buffer layer 15, the p type cladding layer 7, the active layer 8, and the n type cladding layer 9 form a stripe-shaped mesa structure. An i type current blocking layer 5a, an n type current blocking layer 6, and an i type current blocking layer 5b are disposed in this order, contacting both sides of the mesa structure. An n type InP contact layer 12 is disposed on the mesa structure and on the i type current blocking layer 5b. An n side electrode 21 is disposed on the n type contact layer 12 and a p side electrode 31 is disposed on the rear surface of the n type substrate 10. This laser device oscillates when a voltage is applied so that the p side electrode 31 on the rear side of the substrate 10 is positive and the n side electrode 21 on the front side of the substrate 10 is negative.

Also in the semiconductor laser shown in FIG. 2, since the ohmic contact of the n side electrode 21 with the n type contact layer 12 is a contact of the electrode metal with n type InP, a low contact resistivity is easily realized for the ohmic contact. In addition, since the tunnel diode structure 20 is disposed on the substrate 10 in the reverse bias direction with respect to the current flow direction, current flows due to the tunnel effect, so that the voltage drop is small. Further, since the n type InP substrate 10 is used as a substrate on which the tunnel diode structure 20 is grown and the p side electrode 31 is disposed on the rear surface of the n type InP substrate 10, the ohmic contact of the p side electrode 31 with the substrate 10 is a contact of the electrode metal with n type InP, so that a contact resistivity lower than $1 \times 10^{-5}$ $\Omega cm^2$ is easily realized for the ohmic contact. Furthermore, as described in the first embodiment, the contact resistivity within the tunnel diode structure 20 is reduced to, for example, $1 \times 10^{-5}$ $\Omega cm^2$ or lower, with an increase in the carrier concentration of the semiconductor layers 2 and 3 constituting the tunnel diode structure 20. As a result, the substantial contact resistivity of the laser structure on the side of the p side electrode 31 is reduced. Therefore, even in a semiconductor laser structure in which current flows from the rear side of the substrate toward the front side thereof, an ohmic contact having a low contact resistivity is realized between the p side electrode and the semiconductor layer.

As described above, according to the second embodiment of the present invention, the tunnel diode structure 20 is disposed on the n type InP substrate 10, and the stripe-shaped mesa structure comprising the p type buffer layer 15, the p type cladding layer 7, the active layer 8, and the n type cladding layer 9 is disposed on the tunnel diode structure 20. The mesa structure is buried in the current blocking structure comprising the i type current blocking layer 5a, the n type current blocking layer 6, and the i type current blocking layer 5b. The n type contact layer 12 is disposed on the mesa structure and on the i type current blocking layer 5b. The n side electrode 21 is disposed on the n type contact layer 12 and the p side electrode 31 is disposed on the rear surface of the n type substrate 10. Therefore, even in a semiconductor laser structure in which current flows from the rear side of the substrate toward the front side thereof, an ohmic contact having a low contact resistivity is realized between the p side electrode and the semiconductor layer.

While in the first and second embodiments n type InP is employed as a material of the substrate 10, the present invention may be applied to semiconductor lasers including substrates of other materials, for example, an n type InGaAs ternary mixed crystal substrate, with the same effects as described above.

However, when an InGaAs substrate is employed in the semiconductor lasers according to the first and second embodiments of the invention, in order to prevent the InGaAs substrate from absorbing laser light, the semiconductor laser must be designed so that the substrate is about 2.5 μm away from the InGaAsP active layer.

While in the first and second embodiments a semiconductor laser having a stripe-shaped mesa structure is employed, the present invention may be applied to semiconductor lasers having other current concentrating structures, such as a stripe-shaped ridge structure, with the same effects as described above.

Furthermore, while in the first and second embodiments a single InGaAsP layer is employed for the active layer, an active layer having a structure that provide an effective band gap energy smaller than that of the adjacent cladding layer, for example, an active layer having a multi quantum well (MQW) structure comprising a plurality of InGaAsP layers or an active layer having a single quantum well (SQW) structure, may be employed with the same effects as described above.

What is claimed is:

1. A semiconductor laser comprising:

an n type semiconductor substrate having opposed front and rear surfaces;

an n type cladding layer disposed on the front surface of the n type semiconductor substrate;

an active layer disposed on the n type cladding layer and having an effective band gap energy;

a p type cladding layer disposed on the active layer;

a tunnel diode structure comprising a high dopant concentration p type semiconductor layer and a high dopant concentration n type semiconductor layer, these semiconductor layers comprising a material having an effective band gap energy larger than the band gap energy of the active layer and being successively disposed on the p type cladding layer;

a p side electrode disposed directly on the tunnel diode structure and comprising a metal; and an n side electrode disposed on the rear surface of the n type semiconductor substrate.

2. The semiconductor laser of claim 1 wherein the active layer has a structure producing light having a wavelength longer than 1 μm, and 60959/cmcg the high dopant concentration p type semiconductor layer and the high dopant concentration n type semiconductor layer are InP.

3. The semiconductor laser of claim 1 wherein the n type semiconductor substrate, the n type cladding layer, and the high dopant concentration n type semiconductor layer comprise n type InP, the p type cladding layer and the high dopant concentration p type semiconductor layer comprise p type InP, the active layer comprises a single InGaAsP layer or a plurality of InGaAsP layers, and the p side electrode and the n side electrode are selected from the group consisting of Cr/Au and Ti/Pt/Au.

4. The semiconductor laser of claim 1 wherein the n type semiconductor substrate comprises n type InGaAs, the n type cladding layer and the high dopant concentration n type semiconductor layer comprise n type InP, the p type cladding layer and the high dopant concentration p type semiconductor layer comprise p type InP, the active layer comprises a single InGaAsP layer or a plurality of InGaAsP layers, the p side electrode and the n side electrode are selected from the group consisting of Cr/Au and Ti/Pt/Au, and the active layer is separated from the n type semiconductor substrate by a distance sufficient to prevent light produced in the active layer from reaching the substrate.

5. A semiconductor laser comprising:

an n type semiconductor substrate having opposed front and rear surfaces;

a tunnel diode structure comprising a high dopant concentration n type semiconductor layer and a high dopant concentration p type semiconductor layer, these semiconductor layers comprising a material having an effective band gap energy;

a p type cladding layer supported by the tunnel diode structure;

an active layer disposed on the p type cladding layer and comprising a material having an effective band gap energy smaller than the effective band gap energy of the semiconductor layers constituting the tunnel diode structure;

an n type cladding layer disposed on the active layer;

an n type contact layer disposed on the n type cladding layer;

an n side electrode disposed on the n type contact layer and comprises a metal; and a p side electrode disposed on the rear surface of the substrate and comprises a metal.

6. The semiconductor laser of claim 5 wherein the active layer has a structure producing a light having a wavelength longer than 1 μm, and the high dopant concentration p type semiconductor layer and the high dopant concentration n type semiconductor layer are InP.

7. The semiconductor laser of claim 5 wherein the n type semiconductor substrate, the high dopant concentration n type semiconductor layer, the n type cladding layer, and the n type contact layer comprise n type InP, the p type cladding layer and the high dopant concentration p type semiconductor layer comprise p type InP, the active layer comprises a single InGaAsP layer or a plurality of InGaAsP layers, and the p side electrode and the n side electrode are selected from the group consisting of Cr/Au and Ti/Pt/Au.

8. The semiconductor laser of claim 5 wherein the n type semiconductor substrate comprises n type InGaAs, the high dopant concentration n type semiconductor layer, the n type cladding layer, and the n type contact layer comprise n type InP, the p type cladding layer and the high dopant concentration p type semiconductor layer comprise p type InP, the active layer comprises a single InGaAsP layer or a plurality of InGaAsP layers, the p side electrode and the n side electrode are selected from the group consisting of Cr/Au and Ti/Pt/Au, and the active layer is separated from the n type semiconductor substrate by a distance sufficient to prevent light produced in the active layer from reaching the substrate.

9. The semiconductor laser of claim 5 including a p-type buffer layer interposed between and contacting the tunnel diode structure and the p-type cladding layer.

\* \* \* \* \*